United States Patent [19]

Waldeck

[11] Patent Number: 4,680,555

[45] Date of Patent: Jul. 14, 1987

[54] WIDE FREQUENCY RANGE, SWITCHED BAND-OSCILLATOR

[75] Inventor: Gerald Waldeck, Waterloo, Canada

[73] Assignee: Electrohome Limited, Kitchener, Canada

[21] Appl. No.: 880,570

[22] Filed: Jun. 30, 1986

[51] Int. Cl.[4] .............................................. H03B 5/20
[52] U.S. Cl. ............................... 331/108 D; 331/111; 331/179; 358/158
[58] Field of Search .................. 331/108 D, 111, 179, 331/177 R, 177 V; 358/148, 152, 158

[56] References Cited

U.S. PATENT DOCUMENTS

| | | | |
|---|---|---|---|
| 3,889,210 | 6/1975 | Matsuura et al. | 331/179 X |
| 4,274,067 | 6/1981 | Uzunoglu | 331/179 X |
| 4,353,038 | 10/1982 | Rose et al. | 331/179 X |

Primary Examiner—Siegfried H. Grimm
Attorney, Agent, or Firm—Sim & McBurney

[57] ABSTRACT

A wide frequency range, switched-band, output signal from an oscillator is obtained by dividing the overall oscillator bandwidth into two bands having an overlapping band of frequencies. An input signal that triggers the oscillator also is supplied to a frequency-to-voltage converter. The magnitude of its output signal is compared to a reference signal in a comparator, and a control signal having a certain characteristic is derived when the input signal is in the high band of frequencies. When the input signal is in the low band, the control signal has a characteristic that is different from the first-mentioned characteristic. Switching takes place in the overlapping band of frequencies. The control signal is applied to a switching device that adds or removes impedance, e.g., capacitance from the capacitive part of the, for example, resistive-capacitive, frequency-determining network of the oscillator depending upon the characteristic of the control signal.

13 Claims, 2 Drawing Figures

WIDE FREQUENCY RANGE, SWITCHED BAND-OSCILLATOR

BACKGROUND OF THE INVENTION

The assignee of the present invention currently is manufacturing and selling two, raster scan, colour projectors. One is a video/data/graphics projector accommodating horizontal frequency scanning rates from 15 KHz (television) to 32 KHz. The other is a CAD/CAM projector that scans horizontally from 32 KHz to 71 KHz. Prior to the present invention, it was not possible to provide a single projector that would accommodate the total range from 15 KHz to 71 KHz while maintaining ease of customer operation.

SUMMARY OF THE INVENTION

In a preferred embodiment of the invention, apparatus embodying the invention resolves the small signal level generation of horizontal deflection frequencies providing a range from 15 KHz to 80 KHz (for the specific embodiment to be described herein). In other words, it resolves the problem of providing a very large frequency range (15 to 80 KHz) from a low signal level commercial IC that typically is manufactured for the TV industry for use at 15.7 KHz ±500 Hz. The technique that is employed makes it possible to retain for use commercially available horizontal processing I.C.'s that are convenient for their several system functions, e.g., sync separation of composite video; AFC between sync and oscillator and between oscillator and horizontal flyback pulse; ramp generation; output driver with symmetrical duty cycle with frequency; and variable phase control.

While the present invention is particularly useful in connection with horizontal deflection circuitry, its use is not restricted thereto, and the invention may be used generally with oscillators having a resistive-capacitive, frequency-determining network.

An aspect of this invention is as follows:

Apparatus for providing a wide frequency range, switched-band, output signal from an oscillator, said apparatus comprising: an oscillator including a network having first and second different types of impedances, said impedances determining the frequency of the output signal of said oscillator; means for switching into and out of said network additional impedance of said first type to switch between two bands of frequencies, an upper band and a lower band, said bands having an overlapping band of frequencies, said switching means comprising frequency-to-voltage converting means having an input terminal for receiving an input signal having a frequency within said wide frequency range and having an output terminal at which is provided an output signal having a magnitude that varies responsive to the frequency of said input signal, voltage comparator means for comparing the magnitude of said output signal with the magnitude of a reference signal and producing a control signal having a certain characteristic when said output signal is of a magnitude indicative of said input signal having a frequency within said upper band and a characteristic different from said certain characteristic when said output signal is of a magnitude indicative of said input signal having a frequency within said lower band, switching between said control signals having different characteristics taking place within said overlapping band of frequencies, and means responsive to said control signal for adding or removing additional impedance of said first type to or from said network depending upon the characteristic of said control signal; and means for supplying said input signal to said oscillator.

BRIEF DESCRIPTION OF THE DRAWING

This invention will become more apparent from the following detailed description, taken in conjunction with FIGS. 1a and 1b of the appended drawing, which is a schematic diagram showing the invention in conjunction with horizontal deflection circuitry of known type.

DETAILED DESCRIPTION OF THE INVENTION INCLUDING THE PREFERRED EMBODIMENT

Figure 1A:
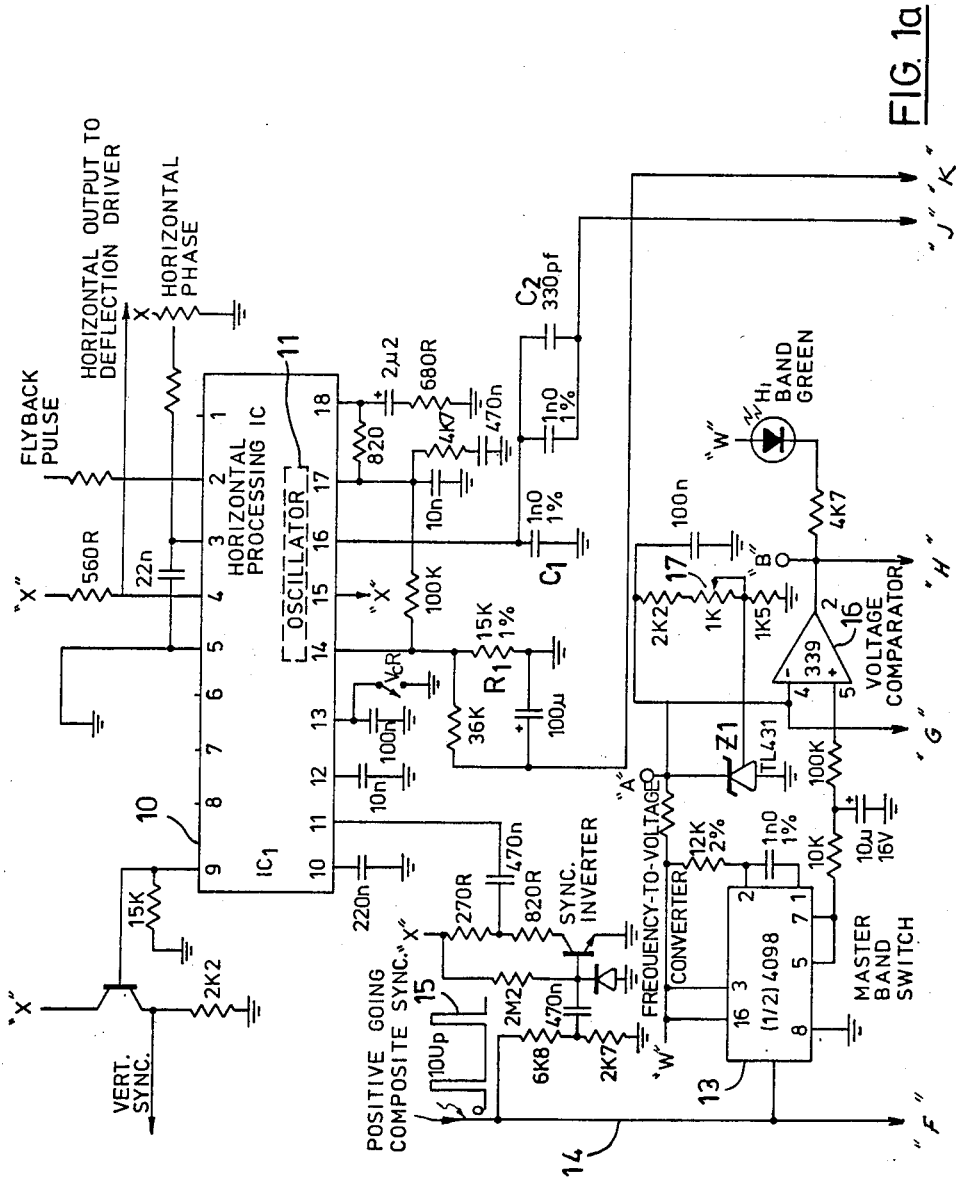
Figure 1B:
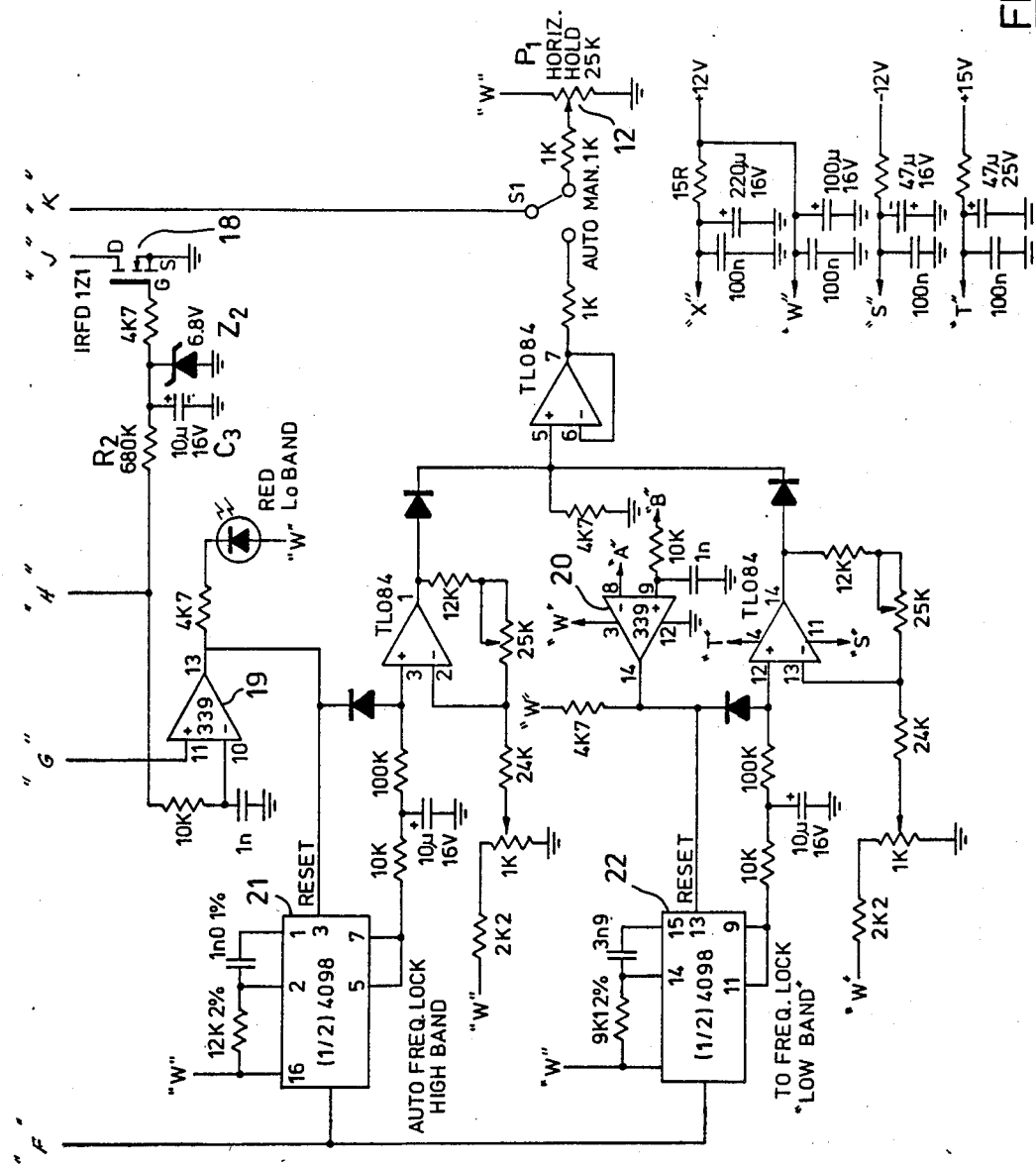

Referring to FIGS. 1a and 1b, reference numeral 10 designates a conventional, horizontal processing I.C. that performs the functions hereinbefore noted. Typical of these I.C.'s are the Philips ® or Signetics ® family TDA 2593 through TDA 2595 and the SGS TDA 1180. The I.C. shown is a TDA 2595.

Included within I.C. 10 is a horizontal oscillator 11 represented by dotted lines. Oscillator 11 has a resistive-capacitive, frequency-determining network, the major components of which are a resistor R1 and a capacitor C1.

In addition to resistor R1, a horizontal hold potentiometer P1 is provided and can be connected so that the part of potentiometer P1 between the slider 12 thereof and ground is in parallel with resistor R1 when a switch S1 is in the manual position. Thus, by varying the setting of slider 12 with switch S1 in the manual position, the value of the resistive part of the resistive-capacitive, frequency-determining network of oscillator 11 can be changed, thereby changing the frequency of the output signal of oscillator 11 and of the horizontal deflection signal.

According to the present invention, the overall bandwidth of oscillator 11, which, for the purposes of illustration only, is from 15 KHz to 80 KHz, is divided into two slightly overlapping bands, e.g., an upper band from 80 KHz to 34 KHz and a lower band from 36 KHz to 15.6 KHz. Band selection is accomplished by varying the capacitive value of the capacitive part of the resistive-capacitive, frequency-determining network of oscillator 11, this being accomplished by selectively removing a capacitor C2 from or introducing it into the aforementioned network. Once either band has been selected, with switch S1 in the manual position, frequencies within the band can be selected by varying the position of slider 12 of potentiometer P1.

The technique for accomplishing this selectivity now will be particularized. Thus, as shown in the Figure, there is provided a frequency-to-voltage converter 13 which, in the embodiment shown, is one-half of a 4098 monostable multivibrator. The input terminal (pin 4) thereof is connected to a line 14 on which there is the incoming sync signal 15 of any applied signal, this same sync signal also being supplied to oscillator 11 via pin 11 of I.C. 10. The level of the output signal of converter 13 is directly proportional to the frequency of input signal 15 and will be at a specific magnitude when this frequency is at a predetermined value, say 35 KHz, within the overlapping frequency range of the upper and lower bands. In the illustrated embodiment, the output voltage of converter 13 increases with a decrease in the frequency of input signal 15.

The output signal of converter 13 is supplied to one input terminal (pin 5) of a 339 voltage comparator 16. A reference signal (from a Zener diode Z1) is supplied to the other input terminal (pin 4) of voltage comparator 16. To accommodate variances in the oscillator ranges and in the frequency-to-voltage transfer, the reference signal may be made adjustable via a control, i.e., a variable resistance network 17 forming part of a resistive divider network across a three terminal programmable Zener (such as a Texas Instrument® TL431).

In any event, voltage comparator 16 functions so that when the output signal level of converter 13 is at a level below the level of the reference signal, output signals of this level being produced by input signals 15 in the high frequency band, comparator 16 produces an output of one definite characteristic, in this case 0 volts. However, when input signal 15 is in the overlapping frequency band, at a frequency of, say, 35 KHz, the level of the output signal of converter 13 becomes equal to the level of the reference signal, and comparator 16 produces an output of a definite characteristic, in this case +12 volts, different from the first-mentioned characteristic. For input signals 15 having lower frequencies than 35 KHz in the low frequency band, the output of comparator 16 remains at +12 volts.

The output of comparator 16 is supplied to a switch, which, in the preferred embodiment of the invention, is a MOSFET transistor 18. Transistor 18 functions to switch capacitor C2 into and out of the resistive-capacitive, frequency-determining network of oscillator 11 to effect a band switch from the lower to the higher band and vice versa when capacitor C2 is switched out of and into respectively the frequency-determining network. This is accomplished by controlling the conduction of transistor 18. Conduction of transistor 18 is achieved when the gate voltage of transistor is above its threshold voltage of 2.5 volts. Thus, when comparator 16 is toggled to provide +12 volts to the gate of transistor 18, MOSFET transistor 18 is placed in hard conduction with a channel resistance of about two ohms, capacitor C2 is inserted into the frequency-determining network of oscillator 11, and the lower band of from 36 KHz to 15.6 KHz is selected.

On the other hand, when the output of comparator 16 is 0 volts, as it is whenever input signal 15 is in the high frequency band, the gate voltage of transistor 18 necessarily will be below the threshold voltage of 2.5 volts. Therefore transistor 18 appears as an open circuit, and capacitor C2 thus is out of the frequency-determining network of oscillator 11, as a result of which high band operation is achieved.

The frequency bandswitch described hereinbefore is quite abrupt. Indeed, it may be too abrupt for a feedback deflection system that monitors raster width.

From the relationship $$Vcc = B + \left(1.637 + \frac{\pi \, t \, \text{scan}}{2 \, t \, \text{RETRACE}}\right),$$

it can be seen that if frequency changes abruptly, the voltage across the deflection transistor could exceed its rating before the system loop reacts and destroys the deflection transistor. This can be avoided by slowing down the change. Since the input impedance of the gate of MOSFET 18 is so high, this can be achieved by introducing a time delay or time constant network between comparator 16 and the gate of transistor 18. Such a network is the RC network composed of resistor R2 and capacitor C3.

Without modification, the voltage excursion of the output of comparator 16 is from 0 volts to 12 volts. MOSFET transistor 18 effects its change in conductivity between a gate voltage of from about two to about four volts. Charging capacitor C3 beyond four volts simply represents wasted time for the user, who then would be made aware of the band change transition. This can be avoided by limiting the upper excursion of the output voltage of comparator 16 to, say, +6 volts, and this is the function performed by Zener diode Z2.

As is conventional, switch S1 affords a choice between manual horizontal hold adjustment or auto-frequency lock. In the present case, however, two, independent, auto-lock circuits optimized for their respective bands are included, each being enabled by a segment 19 and 20 respectively of the 339 comparator at the time of band switching.

There is no necessity for the customer to be aware when band switching occurs. When a signal is applied to, in this case, the projector, sync signal 15 is supplied from the conditioning circuitry (not shown) of the deflection module (not shown). This sync signal 15 feeds the master frequency-to-voltage converter 13 (and the other frequency-to-voltage converters 21 and 22 in the auto-lock networks) and effects the bandswitch. If the customer has selected auto-lock, synchronization on signal 15 at the correct frequency occurs without attention. If manual control has been selected, operation is no more critical than with existing products as far as kilohertz per volt sensitivity is concerned.

More specifically, frequency-to-voltage converter 13 and associated comparator 16 always are enabled, and the output of comparator 16 either is 0 volts on the high band or +12 volts on the low band. This output voltage also is fed as one signal designated "B" to comparators 19 and 20 where it is compared to the reference zener voltage as a second signal designated "A". However, it should be noted that comparators 19 and 20 have the two input signals reversed with respect to their inverting and non-inverting input terminals. Consequently, the output voltages of comparators 19 and 20 will be opposite, one being 0 volts when the other is +12 volts and vice versa. The auto frequency, frequency-to-voltage converter whose reset pin is taken to +12 volts is the one that is functional or "activated". Thus, for the low frequency band 15 KHz to 34 KHz where the output voltage of comparator 16 has toggled to +12 volts, this "B" signal applied to comparator 19 produces a subsequent 0 volt output which, when fed to the reset pin of component 21, disables it. The same +12 volt "B" signal applied to comparator 20 results in a +12 volt output to the reset pin of component 22, enabling that auto frequency segment. The reverse occurs when the sync signal 15 is in the high frequency band 34 KHz to 80 KHz.

While an embodiment of the invention has been disclosed wherein bandswitching is achieved by switching a capacitor into and out of the capacitive part of the frequency-determining network of oscillator 11, the same results can be achieved by switching a resistor into and out of the resistive part of this frequency-determining network. In this case frequency changes within the selected high or low band would be effected by means of a varicap (variable capacitance diode). Such an embodiment is not preferred, however, because of the more limited frequency range of a varicap. Thus, in general, bandswitching may be accomplished by switching into and out of the frequency-determining network of oscillator 11 an impedance that is capable of changing the frequency of oscillator 11.

While a preferred embodiment has been described and illustrated herein, the person skilled in the art will appreciate that changes and modifications may be made therein without departing from the spirit and scope of this invention as defined in the appended claims.

The embodiments of the invention in which an exclusive property or privilege is claimed are defined as follows:

1. Apparatus for providing a wide frequency range, switched-band, output signal from an oscillator, said apparatus comprising: an oscillator including a network having first and second different types of impedances, said impedances determining the frequency of the output signal of said oscillator; means for switching into and out of said network additional impedance of said first type to switch between two bands of frequencies, an upper band and a lower band, said bands having an overlapping band of frequencies, said switching means comprising frequency-to-voltage converting means having an input terminal for receiving an input signal having a frequency within said wide frequency range and having an output terminal at which is provided an output signal having a magnitude that varies responsive to the frequency of said input signal, voltage comparator means for comparing the magnitude of said output signal of said converting means with the magnitude of a reference signal and producing a control signal having a certain characteristic when said output signal is of a magnitude indicative of said input signal having a frequency within said upper band and a characteristic different from said certain characteristic when said output signal is of a magnitude indicative of said input signal having a frequency within said lower band, switching between said control signals having different characteristics taking place within said overlapping band of frequencies, and means responsive to said control signal for adding or removing additional impedance of said first type to or from said network depending upon the characteristic of said control signal; and means for supplying said input signal to said oscillator.

2. Apparatus according to claim 1 wherein said characteristic is magnitude and further including time delay means connected between said voltage comparator means and said responsive means.

3. Apparatus according to claim 2 wherein said time delay means is a resistive-capacitive time constant network.

4. Apparatus according to claim 2 including means for limiting the magnitude of the signal developed from said control signal by said time delay means.

5. Apparatus according to claim 4 wherein said limiting means is a Zener diode.

6. Apparatus according to claim 4 wherein said time delay means is a resistive-capacitive time constant network.

7. Apparatus according to claim 6 wherein said limiting means is a Zener diode.

8. Apparatus according to claim 1 including means for varying the impedance value of said second type of impedance to vary the frequency of said output signal within each of said bands.

9. Apparatus according to claim 1 including means for varying the magnitude of said reference signal.

10. Apparatus according to claim 1 wherein said characteristic is the level of said control signal.

11. Apparatus according to claim 1 wherein said different types of impedances are resistance and capacitance.

12. Apparatus according to claim 11 wherein said first type of impedance is capacitance and said second type of impedance is resistance.

13. Apparatus according to claim 12 including means for varying the value of said resistance to vary the frequency of said output signal within each of said bands.

* * * * *